(12) United States Patent
Ding et al.

(10) Patent No.: US 9,184,784 B2
(45) Date of Patent: Nov. 10, 2015

(54) METHOD AND APPARATUS FOR DIGITAL PREDISTORTION FOR A SWITCHED MODE POWER AMPLIFIER

(71) Applicant: Texas Instruments Incorporated, Dallas, TX (US)

(72) Inventors: Lei Ding, Plano, TX (US); Rahmi Hezar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/203,236

(22) Filed: Mar. 10, 2014

(65) Prior Publication Data

US 2015/0256216 A1    Sep. 10, 2015

(51) Int. Cl.
*H04L 25/03*    (2006.01)
*H04B 1/62*    (2006.01)
*H04L 25/49*    (2006.01)
*H04B 1/04*    (2006.01)

(52) U.S. Cl.
CPC    *H04B 1/62* (2013.01); *H04L 25/49* (2013.01); *H04B 2001/0425* (2013.01)

(58) Field of Classification Search
CPC ............ H04B 1/0475; H04B 2001/0425; H04B 25/03343; H04L 27/368
USPC ................................................ 375/296
See application file for complete search history.

(56) References Cited

U.S. PATENT DOCUMENTS

| 7,346,122 | B1 * | 3/2008 | Cao ............................. 375/296 |
| 2008/0130789 | A1 * | 6/2008 | Copeland et al. ............. 375/297 |
| 2013/0200948 | A1 * | 8/2013 | Lee et al. ...................... 330/10 |

* cited by examiner

*Primary Examiner* — Shuwang Liu
*Assistant Examiner* — David S Huang
(74) *Attorney, Agent, or Firm* — John R. Pessetto; Frank D. Cimino

(57) ABSTRACT

A method includes receiving an input signal and predistorting a baseband representation of the input signal at a carrier frequency and at one or more harmonic frequencies. The method also includes generating an output signal based on the predistorted baseband representation of the input signal, and transmitting the output signal to a power amplifier. Predistorting the baseband representation of the input signal at the carrier frequency could occur in parallel with predistorting the baseband representation of the input signal at the one or more harmonic frequencies.

3 Claims, 8 Drawing Sheets

METHOD AND APPARATUS FOR DIGITAL PREDISTORTION FOR A SWITCHED MODE POWER AMPLIFIER

TECHNICAL FIELD

This disclosure is generally directed to power amplification. More specifically, this disclosure is directed to a method and apparatus for digital predistortion for a switched mode power amplifier, such as for use in a wireless transmitter.

BACKGROUND

Power amplifiers (PAs) are inherently nonlinear devices that are used in a wide variety of communication systems. Digital baseband predistortion is a highly cost-effective way to linearize a power amplifier. Unfortunately, most existing predistortion architectures assume that a power amplifier has a "memoryless" nonlinearity. This means that these architectures assume the output current of a power amplifier depends only on the input current of the power amplifier.

SUMMARY

This disclosure provides an apparatus and method for digital predistortion for a switched mode power amplifier.

In a first example, a method includes receiving an input signal and predistorting a baseband representation of the input signal at a carrier frequency and at one or more harmonic frequencies. The method also includes generating an output signal based on the predistorted baseband representation of the input signal, and transmitting the output signal to a power amplifier.

In a second example, an apparatus includes a digital predistortion block having a first processing unit and second processing units. The first processing unit is configured to receive an input signal and predistort a baseband representation of the input signal at a carrier frequency. The second processing units are configured to receive the input signal and predistort a baseband representation of the input signal at one or more harmonic frequencies. The digital predistortion block configured to generate an output signal based on the predistorted baseband representation of the input signal and transmit the output signal to a power amplifier.

In a third example, a non-transitory computer readable medium is encoded with computer-executable instructions. The instructions when executed cause at least one processing device to receive an input signal, predistort a baseband representation of the input signal at a carrier frequency and at one or more harmonic frequencies, generate an output signal based on the predistorted baseband representation of the input signal, and transmit the output signal to a power amplifier.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
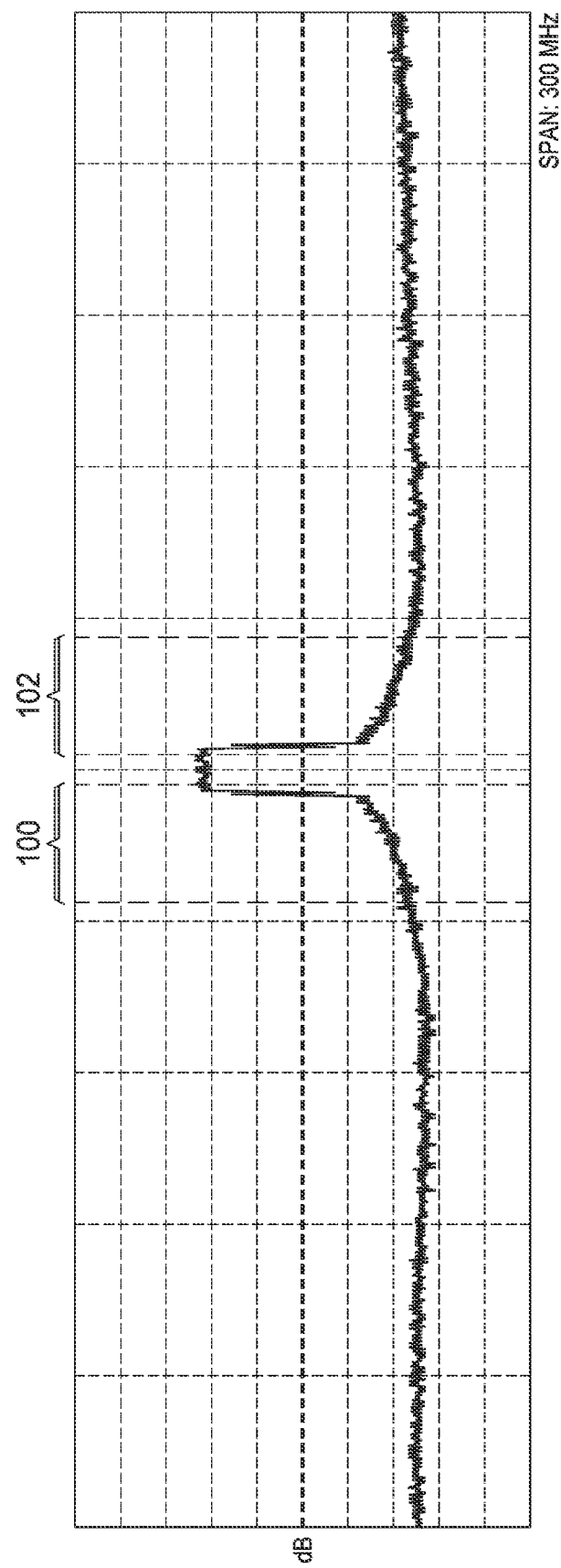
FIG. 1 illustrates a problem of nonlinearity in power amplifiers such as switched mode power amplifiers.

FIGS. 1 through 10, discussed below, and the various examples used to describe the principles of the present invention in this patent document are by way of illustration only and should not be construed in any way to limit the scope of the invention. Those skilled in the art will understand that the principles of the present invention may be implemented in any suitable manner and in any type of suitably arranged device or system.

Power amplifiers (PAs) are ubiquitous components in communication systems, particularly in wireless transmitters. Most PAs are inherently nonlinear, meaning their outputs are not linearly related to their inputs. It is well-known that there is an approximately inverse relationship between the efficiency and linearity of a PA. Hence, nonlinear PAs are desirable from an efficiency point of view. However, the nonlinearity may cause spectral regrowth (broadening), which leads to adjacent channel interference. Nonlinearity may also cause in-band distortion, which degrades the bit error rate (BER) performance. Some transmission formats are particularly vulnerable to PA nonlinearities due to their high peak-to-average power ratios, which correspond to large fluctuations in their signal envelopes. In order to comply with spectral masks imposed by regulatory bodies and to reduce BER, PA linearization may be necessary.

Of all PA linearization techniques, digital baseband predistortion is among the most cost-effective. A predistorter is a functional block that precedes the PA. The predistorter generally acts to create an expanding nonlinearity in the PA input signal since the PA has a compressing characteristic. In an ideal case, the PA output would be a scalar multiple of the input to the predistorter-PA chain. For a memoryless PA (meaning a PA whose output current depends only on its input current), memoryless predistortion is sufficient.

Like many other power amplifiers, switched mode PAs exhibit nonlinear behaviors, but the nonlinearity of switched mode PAs is typically worse for higher output powers and higher efficiency operations. For discrete-time switching signals driving a switched mode PA, the nonlinearity comes from a non-ideal switching waveform, such as rise/fall time mismatches. Typical digital predistortion techniques may not be able to linearize this type of amplifier.

Embodiments of this disclosure provide predistorter models that capture nonlinearity behaviors of switching signals for a switched mode PA. The predistorter models disclosed here include terms that are not present in predistorter models for other types of PAs. Among other things, the disclosed embodiments help a switched mode PA to meet linearity requirements defined by industry standards. Without the disclosed predistorter models, the PA may have to back off significantly, which reduces output power and efficiency.

The embodiments disclosed here are applicable to various communication systems, such as those where efficiency and cost considerations of a power amplifier system are important factors. For example, the disclosed embodiments can be applicable for use in a wireless transmitter (such as a portable device or a base station) in a number of wireless mobile communication systems (such as LTE, LTE-A, or 5G). It will be understood that the disclosed embodiments may be applicable in other communication systems, as well.

FIG. 1 illustrates a problem of nonlinearity in power amplifiers such as switched mode PAs. In FIG. 1, an amplitude response of a nonlinear PA is plotted over a range of frequencies. As indicated at reference numerals 100-102, the nonlinearity of the PA leads to a high adjacent channel power ratio (ACPR), which is undesirable in most systems.

Figure 2A:
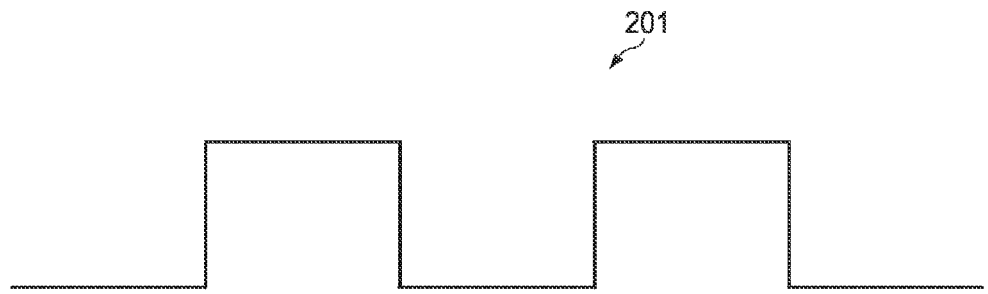
FIGS. 2A and 2B illustrate some causes and effects of nonlinearity in power amplifiers.
Figure 2B:
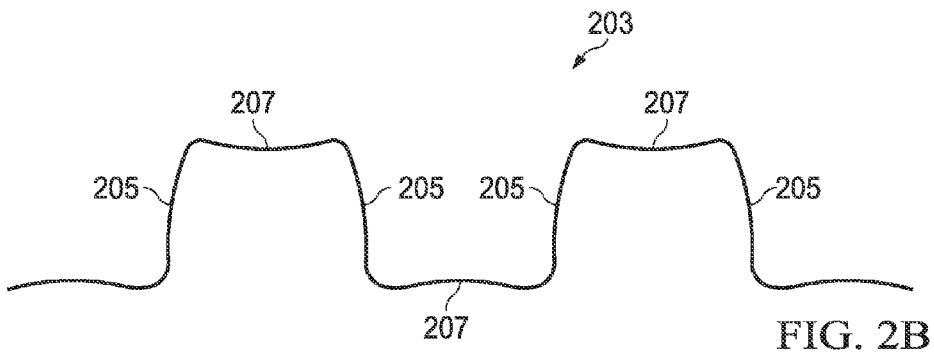

FIGS. 2A and 2B illustrate some causes and effects of nonlinearity in power amplifiers. In FIG. 2A, a plot 201 depicts a square waveform for an ideal power amplifier. As shown in FIG. 2A, the plot 201 exhibits straight vertical and horizontal lines without distortion. In contrast, in FIG. 2B, a plot 203 depicts a representative example waveform of a power amplifier, such as a switched mode PA. The plot 203 shows a number of distortions that cause PA inefficiencies and that lead to excess power usage. For example, distortions 205 in the vertical lines of the waveform can be caused by rise and fall time mismatches in the PA. Likewise, distortions 207 in the horizontal lines of the waveform can be caused by a finite resistance of a transistor in the switching state.

Figure 3:
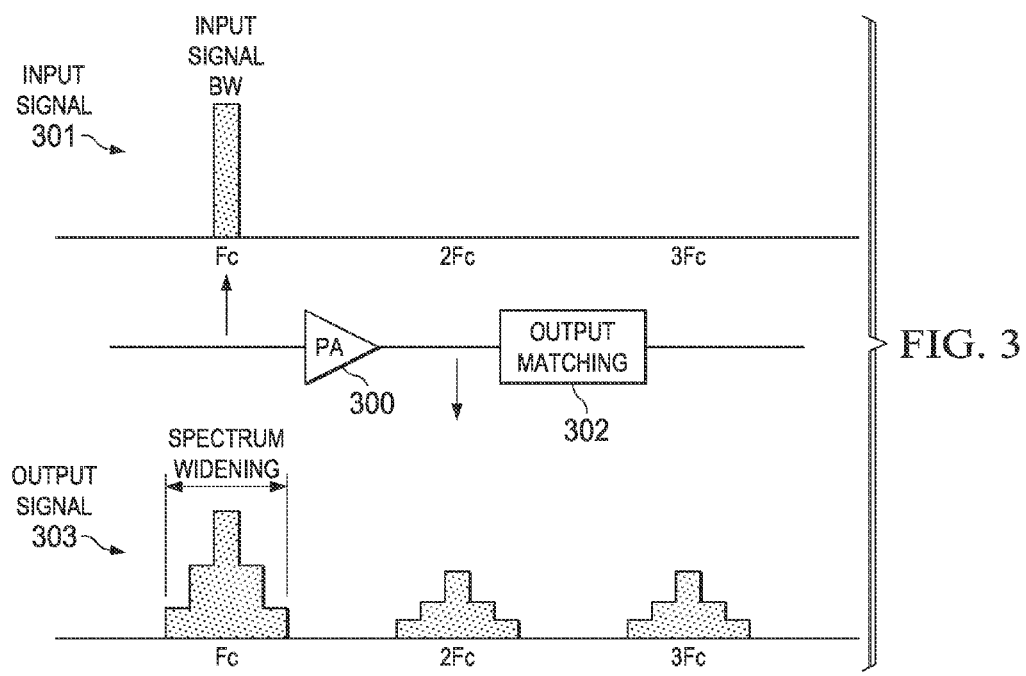
FIG. 3 illustrates an example signal response of a nonlinear power amplifier.

FIG. 3 illustrates an example signal response of a nonlinear PA 300. In FIG. 3, the PA 300 receives an input signal 301 that is concentrated at a carrier frequency Fc. The narrow bandwidth of the input signal 301 indicates minimal signal spreading. The input signal 301 also includes little or no components at harmonic frequencies, such as 2Fc and 3Fc.

As shown in FIG. 3, signal spreading in an output signal 303 occurs at the carrier frequency Fc and at the harmonic frequencies (such as 2Fc and 3Fc) due to the PA 300. In some transmitter implementations, only nonlinearity around the carrier frequency Fc is important, and the nonlinear signals around the harmonic frequencies can be greatly attenuated by an output-matching network 302 of the PA. As a result, in many implementations, it is only important to linearize the carrier frequency Fc, and the harmonic frequencies (such as 2Fc and 3Fc) can be largely ignored.

The linearization of a PA signal is largely determined by the digital predistortion (DPD) model that is used. If a non-optimal DPD model is selected for use with a given nonlinear PA, the linearization results will also be less than optimal.

Note that the PA 300 here may be part of a larger system, such as a transmitter, that includes other components. Also note that the input signal 301 and the output signal 303 may include other signal components at other frequencies.

Figure 4:
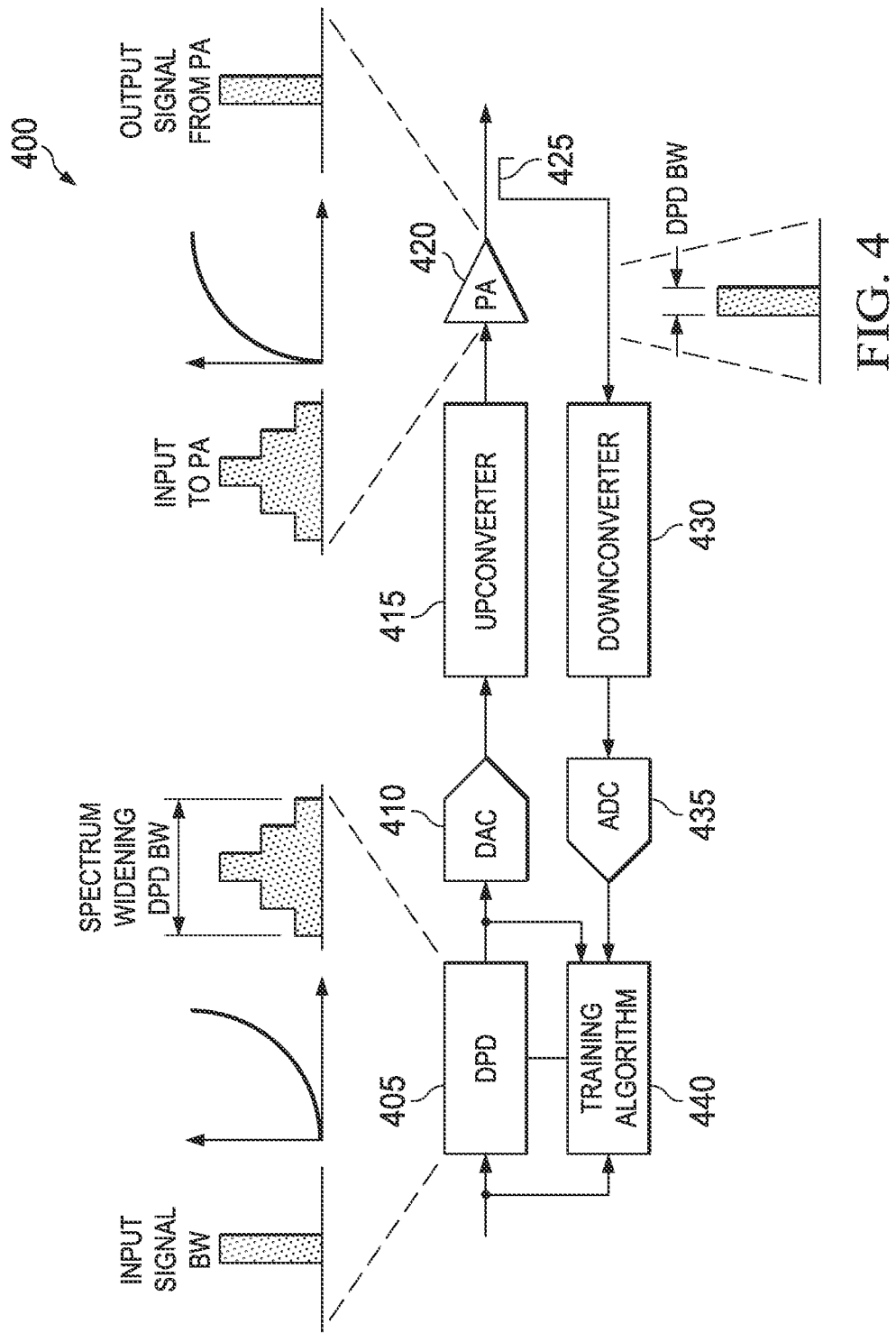
FIG. 4 illustrates an example digital predistortion (DPD) system for use with a power amplifier according to this disclosure.

FIG. 4 illustrates an example digital predistortion (DPD) system 400 for use with a power amplifier according to this disclosure. As shown in FIG. 4, the DPD system 400 includes a DPD block 405, a digital-to-analog converter (DAC) 410, an up-converter 415, a power amplifier 420, a signal coupler 425, a down-converter 430, an analog-to-digital converter (ADC) 435, and a training algorithm block 440. The power amplifier 420 could be coupled to an output-matching network, such as is shown in FIG. 3.

The DPD block 405 acts to reverse or cancel signal compressing characteristics of the PA 420 through spectrum widening of an input signal. The spectrum widening generated by the DPD block 405 is preserved as the signal passes through the DAC 410 and the up-converter 415. Thus, when the signal passes through the DPD block 405 and the PA 420, the result is a much more linear response.

In the DPD system 400, the DPD block 405 is trained as a nonlinear pre-inverse of the PA 420, which creates a spectral widening signal (spectral regrowth) at the output of the DPD block 405. The output is preserved in the analog chain through the DAC 410 and the up-converter 415 before reaching the PA 420 in order to substantially cancel out the PA nonlinearity. The up-converter 415 can upconvert the output of the DAC 410 to a higher frequency signal, such as a radio frequency (RF) signal.

In the DPD system 400 (as in many digital predistortion systems), the nonlinear behavior of the PA 420 may not be known beforehand. Thus, a feedback path with a bandwidth similar to the DPD bandwidth is used to train the DPD block 405. The feedback path here includes the coupler 425, the down-converter 430, the ADC 435, and the training algorithm block 440. The coupler 425 receives a portion of the output signal from the PA 420 and sends the output signal to the down-converter 430, which provides a lower-frequency signal to the ADC 435. The output from the ADC 435 and the input to the DPD block 405 are received at the training algorithm block 440, which includes one or more training algorithms. The training algorithm block 440 can use stored parameters and training algorithms to determine the best DPD model for the DPD block 405 in order to cancel the nonlinearity of the PA 420.

In some systems, difficulties arise because the PA 420 is a nonlinear system with memory, which means the output current of the PA 420 is not dependent only on the input current of the PA 420. As a result, it can be difficult to model and construct an inverse function to be used for digital predistortion.

Baseband and Passband Relationships

Physical systems process real signals. In communication systems, baseband signals are typically in complex form to represent both signals modulated to RF carriers with a quadrature phase relationship. Assume the terms $\tilde{x}(t)$ and $\tilde{y}(t)$ are used to denote baseband input and output signals, respectively. Also assume the terms $x(t)$ and $y(t)$ are used to denote passband input and output signals, respectively. Their relationships can be given as:

$$x(t) = Re[\tilde{x}(t)e^{j\omega_0 t}] \quad (1)$$

$$\tilde{x}(t) = 2\text{LPF}[x(t)e^{-j\omega_0 t}] \quad (2)$$

$$y(t) = Re[\tilde{y}(t)e^{j\omega_0 t}] \quad (3)$$

$$\tilde{y}(t) = 2\text{LPF}[y(t)e^{-j\omega_0 t}] \quad (4)$$

where $\omega_0$ is the carrier frequency and LPF stands for a low-pass filter. The term $x(t)$ can also be written as:

$$x(t) = \tfrac{1}{2}[\tilde{x}(t)e^{j\omega_0 t} + \tilde{x}^*(t)e^{-j\omega_0 t}] \quad (5)$$

For a real input signal, $x(t)$, the Volterra Series can be used to represent a nonlinear system as $$y(t) = \sum_k \int \ldots \int h_k(\tau_k) \prod_{i=1}^{k} x(t - \tau_i) d\tau_k \quad (6)$$

where $\tau_k = [\tau_1, \ldots, \tau_k]^T$, $h_k(.)$ is the k-th order Volterra kernel, and $d\tau_k = d\tau_1 d\tau_2 \ldots d\tau_k$.

Substituting Equation (5) into Equation (6), it can been seen that there are terms located around $e^{\pm j\omega_0 t}$, which are related to the signal in the fundamental frequency zone. In some implementations, there are also terms located at $e^{\pm jn\omega_0 t}$, which are related to signals in the harmonic frequency zones. In many implementations, only the signal in the fundamental zone is important since the signals in the harmonic frequency zones do not interact with the signal at the fundamental frequency and can be ignored or filtered out by analog filters. If all of the terms located around $e^{\pm j\omega_0 t}$ are collected after substituting Equation (5) into Equation (6), it can be shown that:

$$y(t) = e^{-j\omega_0 t} \sum_k \int \cdots \int \frac{\binom{2k+1}{k}}{2^{2k+1}} h_{2k+1}(\tau_{2k+1}) \prod_{i=1}^{k} \tilde{x}(t-\tau_i) e^{-j\omega_0 \tau_i} \prod_{i=k+1}^{2k+1} \tilde{x}^*(t-\tau_i) e^{j\omega_0 \tau_i} d\tau_{2k+1} + \\ e^{j\omega_0 t} \sum_k \int \cdots \int \frac{\binom{2k+1}{k}}{2^{2k+1}} h_{2k+1}(\tau_{2k+1}) \prod_{i=1}^{k+1} \tilde{x}(t-\tau_i) e^{-j\omega_0 \tau_i} \prod_{i=k+2}^{2k+1} \tilde{x}^*(t-\tau_i) e^{j\omega_0 \tau_i} d\tau_{2k+1} \quad (7)$$

Substituting Equation (7) into Equation (4), it can be seen that the baseband representation is:

$$\tilde{y}(t) = \sum_k \int \cdots \int \tilde{h}_{2k+1}(\tau_{2k+1}) \prod_{i=1}^{k+1} \tilde{x}(t-\tau_i) \prod_{i=k+2}^{2k+1} \tilde{x}^*(t-\tau_i) d\tau_{2k+1} \quad (8)$$

where $$\tilde{h}_{2k+1}(\tau_{2k+1}) = \frac{1}{2^{2k}} \binom{2k+1}{k} h_{2k+1}(\tau_{2k+1}) \prod_{i=1}^{k+1} e^{-j\omega_0 \tau_i} \prod_{i=k+2}^{2k+1} e^{j\omega_0 \tau_i} \quad (9)$$

In the discrete-time domain, Equation (8) becomes:

$$\tilde{y}(n) = \sum_k \sum_{l_1} \cdots \sum_{l_{2k+1}} \tilde{h}_{2k+1}(l_1, l_2, \ldots, l_{2k+1}) \prod_{i=1}^{k+1} \tilde{x}(n-l_i) \prod_{i=k+2}^{2k+1} \tilde{x}^*(n-l_i) \quad (10)$$

where $l_1, l_2, \ldots, l_{2k+1}$ are delay terms.

The model represented in Equation (10) is the most general representation. However, this model may be difficult to implement since the number of terms in the model increases dramatically as the nonlinear order and memory depth increase. Practical models often simplify the model to reduce complexity while maintaining good modeling accuracy.

Memoryless PA and PA with Memory Effects

A memoryless passband PA model can be derived by setting all the delay terms, $l_i$, in Equation (10) to zero, which leads to:

$$\tilde{y}(n) = \sum_k \tilde{h}_{2k+1}(0, 0, \ldots, 0) \prod_{i=1}^{k+1} \tilde{x}(n) \prod_{i=k+2}^{2k+1} \tilde{x}^*(n) \quad (11)$$

$$\tilde{y}(n) = \sum_k \tilde{h}_{2k+1} \tilde{x}^{k+1}(n) \tilde{x}^{*k}(n) \quad (12)$$

A passband PA with memory effects can be modeled by setting all delay terms, $l_i$, in Equation (10) to the same value, which leads to:

$$\tilde{y}(n) = \sum_k \sum_l \tilde{h}_{2k+1}(l, l, \ldots, l) \prod_{i=1}^{k+1} \tilde{x}(n-l) \prod_{i=k+2}^{2k+1} \tilde{x}^*(n-l) \quad (13)$$

$$\tilde{y}(n) = \sum_k \sum_l \tilde{h}_{2k+1}(l) \tilde{x}^{k+1}(n-l) \tilde{x}^{*k}(n-l) \quad (14)$$

There are other ways to simplify the model. Regardless of the simplification used, the model includes one more $x(n-l_i)$ term than the $x^*(n-l_i)$ term, as shown in Equation (10).

In order to correct the nonlinearity of a memoryless PA or a PA with memory effects, a DPD (such as the DPD 405 shown in FIG. 4) can be implemented before the PA in the transmission stream. The DPD can be modeled mathematically based on the equations shown above. For example, a memoryless DPD can be used to predistort the memoryless PA model shown in Equation (12). Similarly, a memory DPD can be used to predistort the PA model with memory effects shown in Equation (14).

In the physical implementation of a DPD, some of the calculations can be modeled using lookup tables (LUTs). For example, starting with Equation (12) (which is repeated below), a memoryless DPD model using LUTs can be derived as follows:

$$\tilde{y}(n) = \sum_k \tilde{h}_{2k+1} \tilde{x}^{k+1}(n) \tilde{x}^{*k}(n) \quad (12)$$

$$\tilde{y}(n) = \sum_k \tilde{h}_{2k+1} \tilde{x}(n) |\tilde{x}(n)|^{2k} \quad (15)$$

$$\tilde{y}(n) = \tilde{x}(n) \sum_k \tilde{h}_{2k+1} |\tilde{x}(n)|^{2k} \quad (16)$$

$$\tilde{y}(n) = \tilde{x}(n) \text{LUT}[|\tilde{x}(n)|^2] \quad (17)$$

Accordingly, Equation (17) can be executed by one or more processing blocks within the memoryless DPD.

For a memory DPD, a model using LUTs can be derived as follows, starting with Equation (14) (which is repeated below):

$$\tilde{y}(n) = \sum_k \sum_l \tilde{h}_{2k+1}(l)\tilde{x}^{k+1}(n-l)\tilde{x}^{*k}(n-l) \quad (14)$$

$$\tilde{y}(n) = \sum_k \sum_l \tilde{h}_{2k+1}(l)\tilde{x}(n-l)|\tilde{x}(n-l)|^{2k} \quad (18)$$

$$\tilde{y}(n) = \sum_l \tilde{x}(n-l) \sum_k \tilde{h}_{2k+1}(l)|\tilde{x}(n-l)|^{2k} \quad (19)$$

$$\tilde{y}(n) = \sum_l \tilde{x}(n-l) LUT_l[|\tilde{x}(n-l)|^2] \quad (20)$$

Accordingly, Equation (20) can be executed by one or more processing blocks within the memory DPD.

Figure 5:
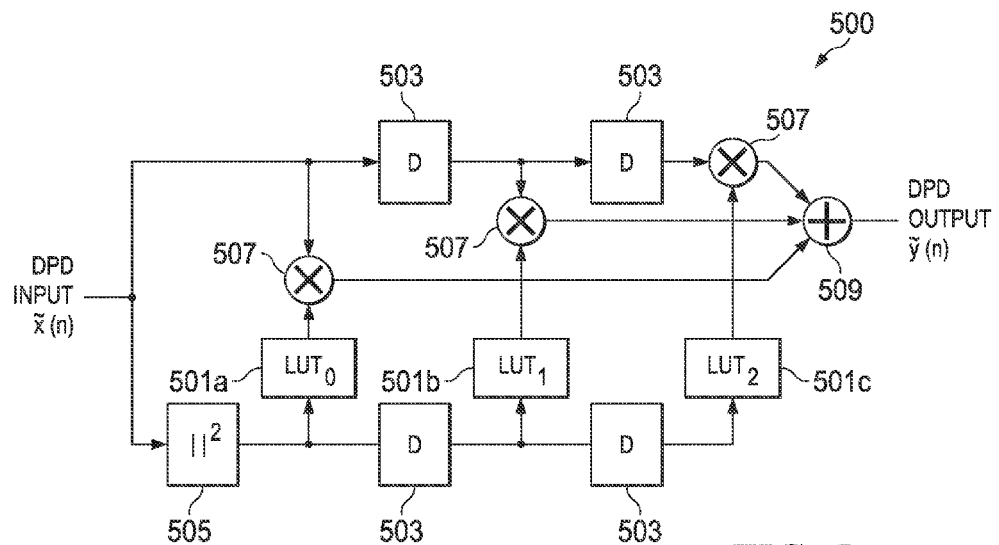
FIG. 5 illustrates an example implementation of a DPD processing block for use within a DPD system according to this disclosure.

FIG. 5 illustrates an example implementation of a DPD processing block 500 for use within a DPD system according to this disclosure. In some embodiments, the DPD processing block 500 may represent or be used in connection with the DPD block 405 of FIG. 4. In particular embodiments, the DPD processing block 500 implements the PA model with memory effects described above.

As shown in FIG. 5, the DPD processing block 500 includes a plurality of lookup tables (LUTs) 501a-501c, a plurality of delay elements 503, an absolute value squaring operator 505, a plurality of multipliers 507, and an adder 509. The number of LUTs and delay elements can be determined by the memory order of the DPD processing block 500. In FIG. 5, the memory order is three, so there are three LUTs in the DPD processing block 500.

The DPD processing block 500 receives a DPD input signal $\tilde{x}(n)$ and processes the DPD input signal using the LUTs 501a-501c and the mathematical operators according to Equation (20) above (implemented using the multipliers 507 and the adder 509). The DPD processing block 500 generates the pre-inversed DPD output signal $\tilde{y}(n)$, which is transmitted to the memoryless PA where the signal is linearized such as shown in FIG. 4.

Although FIG. 5 shows three LUTs 501a-501c, it will be understood that more or fewer LUTs and delay elements may be used as required based on the memory order. For example, in higher-order models, the memory order may be equal to four, five, six, or another value. In such implementations, the number of LUTs and delay elements may be adjusted accordingly.

Digital baseband predistortion is a highly cost-effective way to linearize PAs, but many architectures assume that the PA has a memoryless nonlinearity. However, for some types of power amplifiers (such as a switched mode PAs), PA memory effects cannot be ignored, and memoryless DPD has limited effectiveness.

Figure 6:
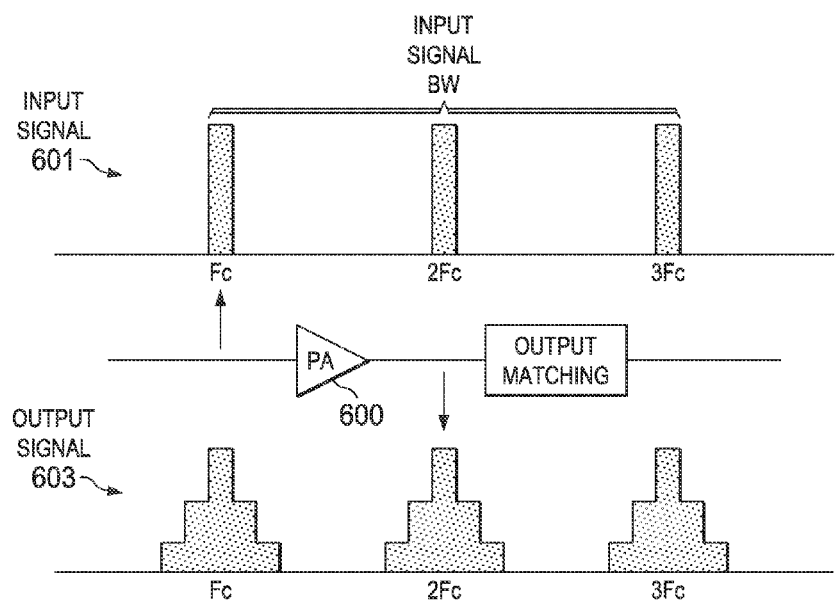
FIG. 6 illustrates an example signal response of a switched mode power amplifier according to this disclosure.

FIG. 6 illustrates an example signal response of a switched mode PA according to this disclosure. As shown in FIG. 6, the PA 600 receives an input signal 601 and processes the signal to generate an output signal 603. The PA 600 is a switched mode PA, which operates like a switch and therefore exhibits different nonlinearity characteristics than other types of PAs. In many respects, the switching properties of the switched mode PA 600 are more characteristic of a digital PA than an analog PA. Likewise, the signal going through the PA 600 exhibits digital-like signal properties with aliasing content. For example, as shown in FIG. 6, the input signal 601 to the PA 600 resembles a digital signal, with higher amplitudes at the carrier frequency Fc and at harmonic frequencies 2Fc and 3Fc. This is in contrast to the PA input signal 301 shown in FIG. 3, which is concentrated at the carrier frequency Fc with little or no amplitude at the harmonic frequencies 2Fc and 3Fc.

The aliasing and nonlinearity of the switched mode PA 600 can cause harmonic contents to fold back in-band. That is, when nonlinear distortion occurs, the nonlinear signal in each harmonic zone can fold back into the fundamental zone because of aliasing. For example, in FIG. 6, nonlinear versions of the input signal 601 at harmonic frequencies 2Fc and 3Fc may fold into the output signal 603 at the carrier frequency Fc.

As a result, the output signal 603 at the carrier frequency Fc can exhibit significant nonlinearity. Some of these distortions at the carrier frequency Fc are a result of the input signal 601 at the harmonic frequencies 2Fc and 3Fc. Similar nonlinearities occur at the output signal 603 at the harmonic frequencies 2Fc and 3Fc. Thus, as shown in FIG. 6, the output signal 603 exhibits significant spectrum widening at the carrier frequency Fc and at the harmonic frequencies 2Fc and 3Fc. Many DPDs may not be able to handle these distortions caused by harmonic folding.

Note that the PA 600 may be part of a larger system, such as a wireless transmitter, that includes other components. Also note that the input signal 601 and the output signal 603 may include components at harmonic frequencies higher than 3Fc (such as 4Fc, 5Fc, and so on).

Because of the distortions caused by harmonic folding, it is helpful to provide a baseband representation of signals in higher order harmonic zones. These signals (or nonlinear distortions) are located at harmonic frequencies. The digital nature of the signal causes the distortions to fold back to the fundamental frequency through aliasing.

To model this, the signal components located at the m-th harmonic zone are derived, based on Equation (7). If the terms around the m-th harmonic zone are selected, some of the 1's in Equation (7) are replaced with m's, and Equation (7) becomes the following:

$$y(t) = e^{-jm\omega_0 t} \sum_k \int \cdots \int \frac{\binom{2k+m}{k}}{2^{2k+m}} h_{2k+m}(\tau_{2k+m})$$

$$\prod_{i=1}^{k} \tilde{x}(t-\tau_i)e^{-j\omega_0\tau_i} \prod_{i=k+1}^{2k+m} \tilde{x}^*(t-\tau_i)e^{j\omega_0\tau_i} d\tau_{2k+m} +$$

$$e^{jm\omega_0 t} \sum_k \int \cdots \int \frac{\binom{2k+m}{k}}{2^{2k+m}} h_{2k+m}(\tau_{2k+m}) \quad (21)$$

$$\prod_{i=1}^{k+m} \tilde{x}(t-\tau_i)e^{-j\omega_0\tau_i} \prod_{i=k+m+1}^{2k+m} \tilde{x}^*(t-\tau_i)e^{j\omega_0\tau_i} d\tau_{2k+m}$$

Aliasing with $e^{j(m+1)\omega_0 t}$ causes the first term on the right hand side of Equation (21) to be aliased back to the fundamental frequency. The baseband representation can be written as:

$$\tilde{y}_{mc}(t) = \sum_k \int \ldots \qquad (22)$$

$$\int \tilde{h}_{2k+m,mc}(\tau_{2k+m}) \prod_{i=1}^{k} \tilde{x}(t-\tau_i) \prod_{i=k+1}^{2k+m} \tilde{x}^*(t-\tau_i) d\tau_{2k+m}$$

where $$\tilde{h}_{2k+m,mc}(\tau_{2k+m}) = \qquad (23)$$

$$\frac{1}{2^{2k+m-1}} \binom{2k+m}{k} h_{2k+m}(\tau_{2k+m}) \prod_{i=1}^{k} e^{-j\omega_0\tau_i} \prod_{i=k+1}^{2k+m} e^{j\omega_0\tau_i}$$

The discrete-time model is given by:

$$\tilde{y}_{mc}(n) = \sum_k \sum_{l_1} \ldots \qquad (24)$$

$$\sum_{l_{2k+1}} \tilde{h}_{2k+m,mc}(l_1, l_2, \ldots, l_{2k+m}) \prod_{i=1}^{k} \tilde{x}(n-l_i) \prod_{i=k+1}^{2k+m} \tilde{x}^*(n-l_i)$$

Here, m can be 0, 1, 2, 3, . . . . For any m that is a non-negative integer, the resulting terms are not present in the model shown in Equation (10). If all delay terms, $l_i$, are set to be equal, then the model is simplified to:

$$\tilde{y}_{mc}(n) = \sum_k \sum_l \tilde{h}_{2k+m,mc}(l) \prod_{i=1}^{k} \tilde{x}(n-l) \prod_{i=k+1}^{2k+m} \tilde{x}^*(n-l) \qquad (25)$$

$$= \sum_k \sum_l \tilde{h}_{2k+m,mc}(l) \tilde{x}^{*m}(n-l) |\tilde{x}(n-l)|^{2k} \qquad (26)$$

$$= \sum_l \tilde{x}^{*m}(n-l) \sum_k \tilde{h}_{2k+m,mc}(l) |\tilde{x}(n-l)|^{2k} \qquad (27)$$

$$= \sum_l \tilde{x}^{*m}(n-l) LUT_{l,mc}[|\tilde{x}(n-l)|^2] \qquad (28)$$

Aliasing with $e^{-(m-1)\omega_0 t}$ causes the second term on the right hand side of Equation (21) to be aliased back to the fundamental frequency. The baseband representation can be written as:

$$\tilde{y}_m(t) = \sum_k \int \ldots \qquad (29)$$

$$\int \tilde{h}_{2k+m,m}(\tau_{2k+m}) \prod_{i=1}^{k+m} \tilde{x}(t-\tau_i) \prod_{i=k+m+1}^{2k+m} \tilde{x}^*(t-\tau_i) d\tau_{2k+m}$$

where $$\tilde{h}_{2k+m,m}(\tau_{2k+m}) = \qquad (30)$$

$$\frac{1}{2^{2k+m-1}} \binom{2k+m}{k} h_{2k+m}(\tau_{2k+m}) \prod_{i=1}^{k+m} e^{-j\omega_0\tau_i} \prod_{i=k+m+1}^{2k+m} e^{j\omega_0\tau_i}$$

The discrete-time model is given by:

$$\tilde{y}_m(n) = \sum_k \sum_{l_1} \ldots \qquad (31)$$

$$\sum_{l_{2k+1}} \tilde{h}_{2k+m,m}(l_1, l_2, \ldots, l_{2k+m}) \prod_{i=1}^{k+m} \tilde{x}(n-l_i) \prod_{i=k+m+1}^{2k+m} \tilde{x}^*(n-l_i)$$

Here, m can be 0, 2, 3, . . . . When m=1, the model becomes Equation (10). For any other m that is a non-negative integer, the resulting terms are not present in the model shown in Equation (10). If all delay terms, $l_i$, are set to be equal, then the model is simplified to:

$$\tilde{y}_m(n) = \sum_k \sum_l \tilde{h}_{2k+m,m}(l) \prod_{i=1}^{k+m} \tilde{x}(n-l) \prod_{i=k+m+1}^{2k+m} \tilde{x}^*(n-l) \qquad (32)$$

$$= \sum_k \sum_l \tilde{h}_{2k+m,m}(l) \tilde{x}^m(n-l) |\tilde{x}(n-l)|^{2k} \qquad (33)$$

$$= \sum_l \tilde{x}^m(n-l) \sum_k \tilde{h}_{2k+m,m}(l) |\tilde{x}(n-l)|^{2k} \qquad (34)$$

$$= \sum_l \tilde{x}^m(n-l) LUT_{l,m}[|\tilde{x}(n-l)|^2] \qquad (35)$$

Figure 7:
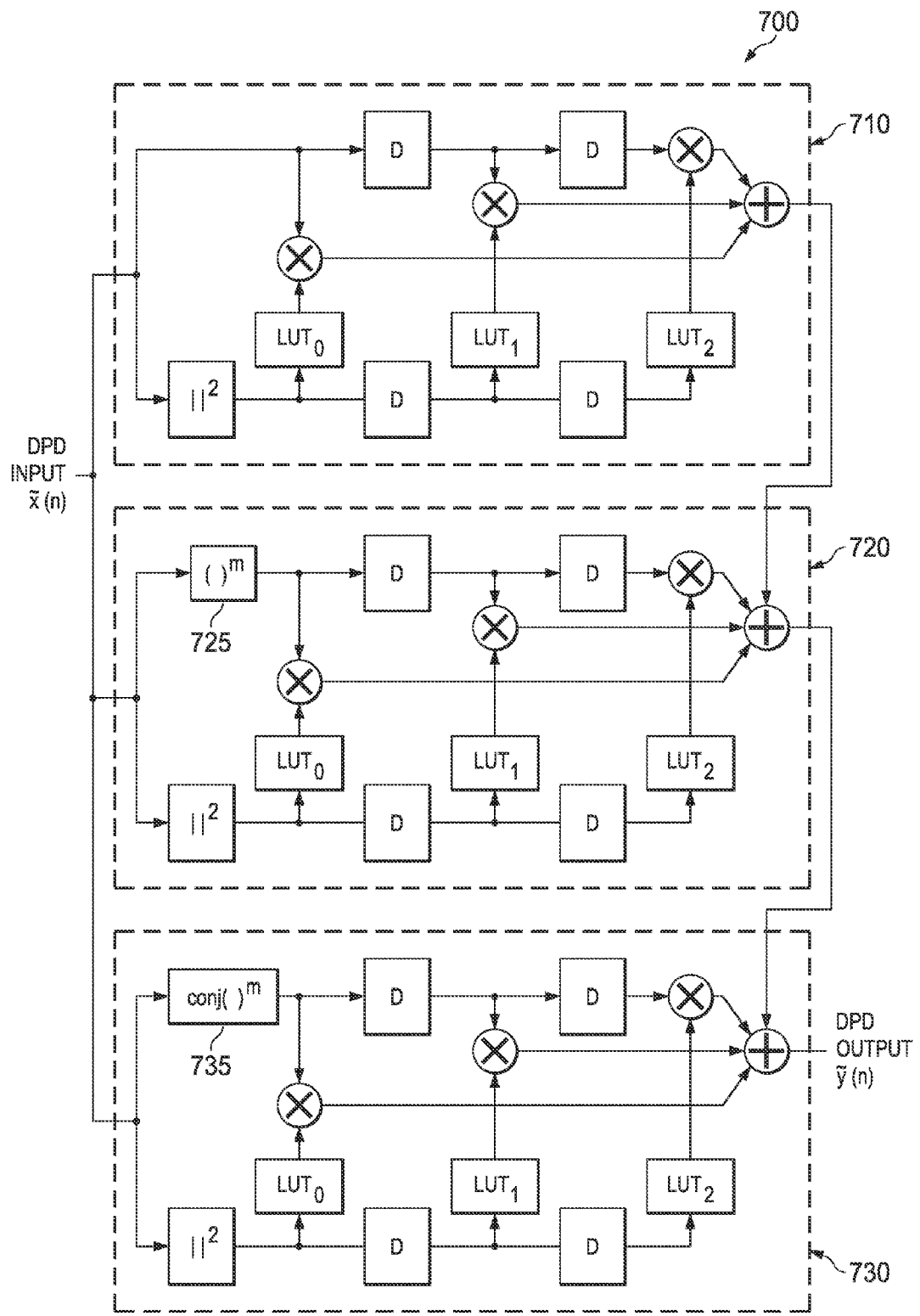
FIG. 7 illustrates an example implementation of a DPD processing block for use within a DPD system that supports distortions caused by a switched mode power amplifier according to this disclosure.

FIG. 7 illustrates an example implementation of a DPD processing block 700 for use within a DPD system that supports distortions caused by a switched mode PA according to this disclosure. In some embodiments, the DPD processing block 700 may represent or be used in connection with the DPD block 405 of FIG. 4. It will be understood that the DPD processing block 700 may be used with other systems, as well.

As shown in FIG. 7, the DPD processing block 700 includes three DPD processing units 710, 720, 730. Like the DPD processing block 500 of FIG. 5, each DPD processing unit 710-730 include a plurality of LUTs, delay elements, an absolute value squaring operator, a plurality of multipliers, and an adder. In addition, the DPD processing unit 720 includes an exponent operator 725, and the DPD processing unit 730 includes a conjugate exponent operator 735. The number of LUTs and delay elements in each processing unit 710-730 can be determined by the memory order of the DPD processing block 700. In FIG. 7, the memory order is 3, so there are three LUTs in each DPD processing unit 710-730.

The DPD processing block 700 receives the DPD input signal $\tilde{x}(n)$ and processes the DPD input signal using the DPD processing units 710-730, which operate in parallel. The DPD processing block 700 generates the pre-inversed DPD output signal $\tilde{y}(n)$, which is transmitted to a switched mode PA (such as PA 420 or PA 600), where the signal is linearized such as shown in FIG. 4.

Because of the aliasing and nonlinearity of the switched mode PA, the DPD processing block 700 is configured to represent and process baseband signals in both the carrier frequency Fc and one or more higher-order harmonic zones, such as harmonic frequencies 2Fc and 3Fc.

In some embodiments, the DPD processing unit 710 is substantially identical to the DPD processing block 500 of FIG. 5. Accordingly, the DPD processing unit 710 is configured to process the baseband representation of the DPD input signal $\tilde{x}(n)$ at the carrier frequency Fc according to Equation (20) above.

The DPD processing units 720 and 730 are configured to process the baseband representation of the DPD input signal $\tilde{x}(n)$ at the m-th harmonic zone. In particular, the DPD processing unit 720 processes the baseband representation of the DPD input signal $\tilde{x}(n)$ at the m-th harmonic zone using Equation (35). As in Equation (35), the value of m in the DPD processing unit 720 can be a non-negative integer other than one (i.e., m can be 0, 2, 3, 4, . . . ). When m=1, the DPD processing unit 720 operates like the DPD processing unit 710.

Similarly, the DPD processing unit 730 processes the conjugate of the baseband representation of the DPD input signal, $\tilde{x}^*(n)$, using Equation (28). As in Equation (28), the value of m in the DPD processing unit 730 can be any non-negative integer (i.e., m can be 0, 1, 2, 3, . . . ).

Comparing Equations (28) and (35), it can be seen that the DPD processing unit 720 uses the m-th power of $\tilde{x}(n)$, while the DPD processing unit 730 uses the m-th power of the conjugate $\tilde{x}^*(n)$. The exponent operations are performed in the DPD processing units 720, 730 by the exponent operator 725 and the conjugate exponent operator 735, respectively. That is, the DPD processing unit 720 receives the baseband representation of the DPD input signal $\tilde{x}(n)$ and performs an exponent operation on $\tilde{x}(n)$ to $\tilde{x}^m$ using the exponent operator 725. Likewise, the DPD processing unit 730 receives the baseband representation of the DPD input signal $\tilde{x}(n)$ and performs an exponent operation on the conjugate $\tilde{x}^*(n)$ to $\tilde{x}^{*m}$ using the conjugate exponent operator 735.

The outputs of the DPD processing block 710-730 are added together to provide the DPD output signal $\tilde{y}(n)$ of the DPD processing block 700. The output can then be transmitted to the switched mode PA.

In FIG. 7, each of the DPD processing units 710-730 may represent any hardware or combination of hardware and software/firmware instructions. The hardware here could include any suitable microprocessors, microcontrollers, discrete circuits, or any other processing or control devices.

Although FIG. 7 illustrates one example of a DPD processing block 700, various changes may be made to FIG. 7. For example, the functional division shown in FIG. 7 is for illustration only. Various components in FIG. 7 could be combined, further subdivided, or omitted and additional components could be added according to particular needs. Also, the handling of higher-order harmonics can involve the use of more DPD processing units. For instance, in order to process other harmonic zones in addition to the m-th harmonic zone, other DPD processing units could be included in parallel with the DPD processing units 710-730.

Figure 8:
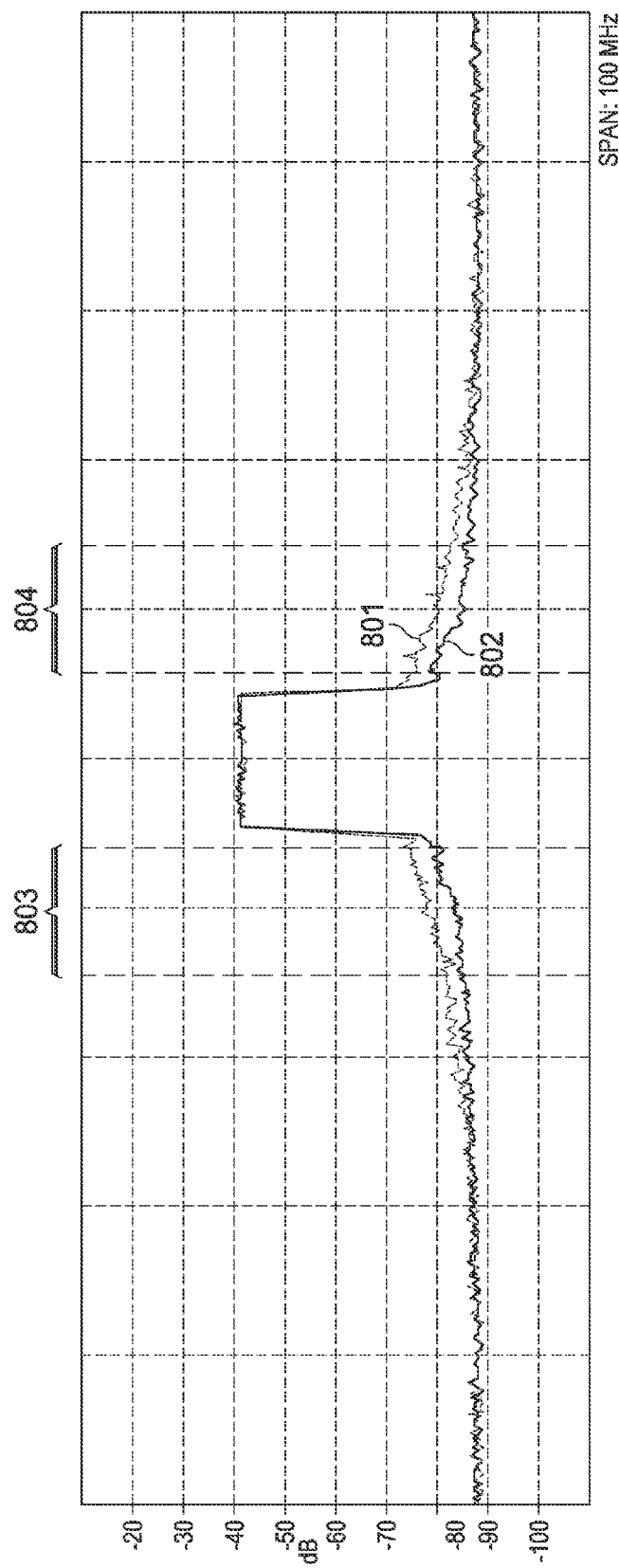
FIGS. 8 and 9 illustrate example test results showing an improvement of nonlinearity using a DPD system according to this disclosure.
Figure 9:
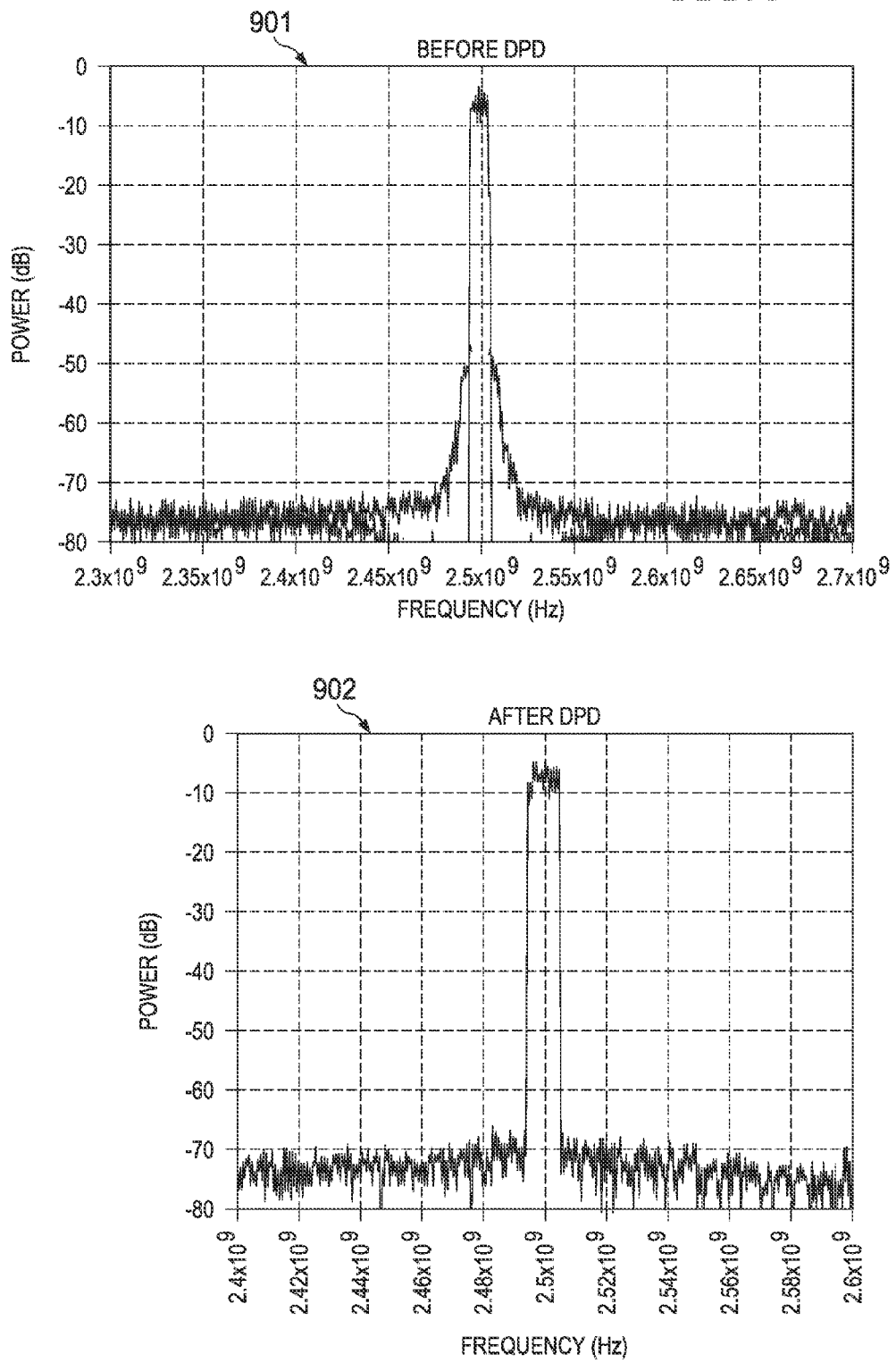

FIGS. 8 and 9 illustrate example test results showing an improvement of nonlinearity using the DPD system 700 according to this disclosure. In FIG. 8, a plot curve 801 depicts an amplitude response of a nonlinear PA, such as a switched mode PA, plotted over a range of frequencies. A plot curve 802 depicts an amplitude response of the same nonlinear PA coupled to the DPD processing block 700. As indicated at reference numerals 803-804, the ACPR of the PA with the DPD is substantially reduced compared to the ACPR of the PA without the DPD.

Likewise, FIG. 9 illustrates results from another test with and without the DPD processing block 700. As seen in FIG. 9, a plot curve 902 shows a significant improvement in ACPR when coupled with the DPD processing block 700 as compared to a plot curve 901, which includes no DPD processing.

Although FIGS. 8 and 9 illustrate examples of test results showing an improvement of nonlinearity using the DPD system 700, the examples shown in FIGS. 8 and 9 are for illustration only. Other implementations and uses of the DPD system 700 could provide different test results.

Figure 10:
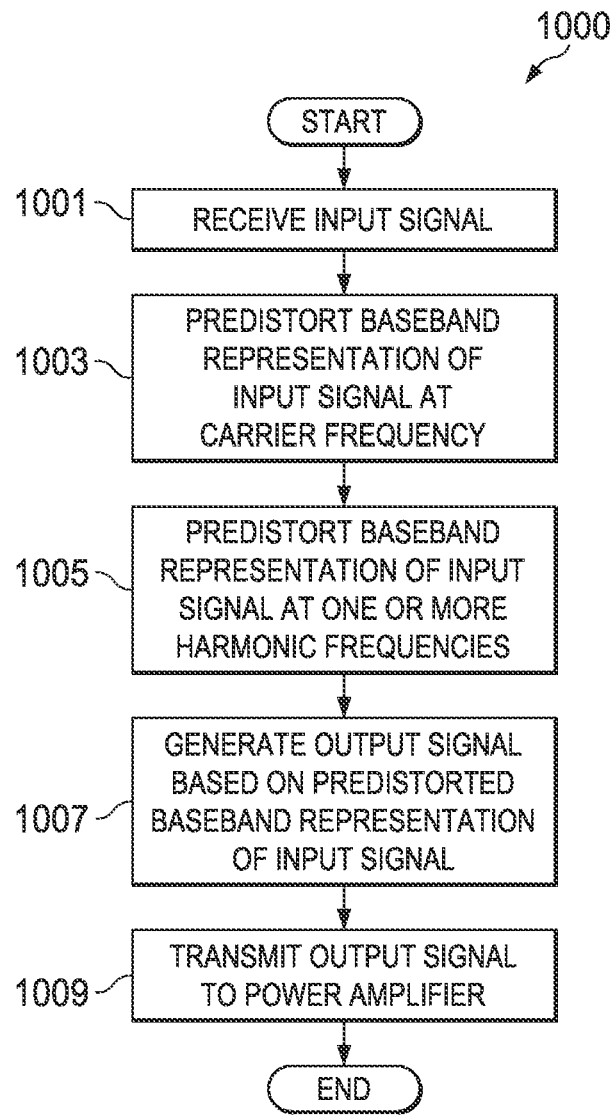
FIG. 10 illustrates an example method for digital predistortion according to this disclosure.

FIG. 10 illustrates an example method 1000 for digital predistortion according to this disclosure. For ease of explanation, the method 1000 is described with respect to the PA 600 operating with the DPD processing block 700 in FIG. 7.

An input signal is received at a digital predistortion block at step 1001. This could include, for example, receiving an input signal having components at a carrier frequency and at one or more harmonic frequencies at the DPD processing block 700. A baseband representation of the input signal is predistorted at the carrier frequency at step 1003. This could include, for example, a first processing unit 710 in the digital predistortion block 700 predistorting the baseband representation of the input signal at the carrier frequency Fc using one or more lookup tables.

The baseband representation of the input signal is predistorted at one or more harmonic frequencies at step 1005. This could include, for example, a second processing unit 720 in the digital predistortion block 700 predistorting the baseband representation of the input signal at the second harmonic frequency 2Fc. This could also include a third processing unit 730 predistorting the conjugate of the baseband representation of the input signal at the second harmonic frequency 2Fc.

An output signal is generated based on the predistorted baseband representation of the input signal at step 1007. This could include, for example, generating the output signal from a sum of the predistorted output signals from the first, second, and third processing units 710, 720, 730. The output signal is transmitted to a power amplifier at step 1009.

Although FIG. 10 illustrates one example of a method 1000 for digital predistortion, various changes may be made to FIG. 10. For example, while FIG. 10 illustrates a series of steps, various steps in each figure could overlap, occur in parallel, occur in a different order, or occur any number of times. Also, one or more of the steps of the method 1000 could be removed, or other steps could be added to the method 1000.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   receiving an input signal;
   predistorting a baseband representation of the input signal at a carrier frequency and at one or more harmonic frequencies;
   generating an output signal based on the predistorted baseband representation of the input signal; and
   transmitting the output signal to a power amplifier;
   wherein predistorting the baseband representation of the input signal at the one or more harmonic frequencies comprises predistorting based on an m-th power of the baseband representation of the input signal and predistorting based on an m-th power of a conjugate of the baseband representation of the input signal, wherein m is a positive integer.

2. An apparatus comprising:
   a digital predistortion block comprising:
      a first processing unit configured to receive an input signal and predistort a baseband representation of the input signal at a carrier frequency; and
      second processing units configured to receive the input signal and predistort a baseband representation of the input signal at one or more harmonic frequencies;
   the digital predistortion block configured to generate an output signal based on the predistorted baseband representation of the input signal and transmit the output signal to a power amplifier;
   wherein the second processing units are configured to predistort based on an m-th power of the baseband representation of the input signal and predistort based on an m-th power of a conjugate of the baseband representation of the input signal, wherein m is a positive integer.

3. A non-transitory computer readable medium encoded with computer-executable instructions that when executed cause at least one processing device to:
   receive an input signal;
   predistort a baseband representation of the input signal at a carrier frequency and at one or more harmonic frequencies;
   generate an output signal based on the predistorted baseband representation of the input signal; and
   transmit the output signal to a power amplifier;
   wherein the instructions that when executed cause the at least one processing device to predistort the baseband representation of the input signal at the one or more harmonic frequencies comprise:
      instructions that when executed cause the at least one processing device to predistort based on an m-th power of the baseband representation of the input signal and predistorting based on an m-th power of a conjugate of the baseband representation of the input signal, wherein m is a positive integer.

* * * * *